United States Patent
Feral et al.

[11] Patent Number: 5,703,425
[45] Date of Patent: Dec. 30, 1997

[54] PROCESS FOR MANUFACTURING A PIEZOELECTRIC COMPONENT

[75] Inventors: Thierry Feral, Seurre; Bernard Fromont, Contes; Ronan Stephan, Varois et Chaignot; Eric Sernit, Mouans-Sartoux; Olivier Lacour, Plan de Grasse, all of France

[73] Assignee: Thomson-CSF, Paris, France

[21] Appl. No.: 495,677

[22] PCT Filed: Jan. 11, 1994

[86] PCT No.: PCT/FR94/00031

§ 371 Date: Jul. 31, 1995

§ 102(e) Date: Jul. 31, 1995

[87] PCT Pub. No.: WO94/17562

PCT Pub. Date: Aug. 4, 1994

[30] Foreign Application Priority Data

Jan. 29, 1993 [FR] France ................... 93 00949

[51] Int. Cl.[6] ......................................... H01L 41/08
[52] U.S. Cl. .................. 310/366; 310/328; 310/330; 310/331
[58] Field of Search ....................... 310/328, 330, 310/331, 366, 367, 800

[56] References Cited

U.S. PATENT DOCUMENTS

| | | | |
|---|---|---|---|
| 2,901,644 | 8/1959 | Tibbetts et al. | 310/328 |
| 3,155,926 | 11/1964 | Meitzler | 333/30 |
| 3,781,955 | 1/1974 | Lavrinenko et al. | 29/25.35 |
| 4,079,437 | 3/1978 | Sheffield | 361/233 |
| 4,330,730 | 5/1982 | Kurz et al. | 310/331 |
| 4,435,667 | 3/1984 | Kolm et al. | 310/367 |
| 4,833,659 | 5/1989 | Geil et al. | 310/332 |
| 4,879,698 | 11/1989 | Langberg | 310/800 |
| 5,559,387 | 9/1996 | Beurrier . | |

FOREIGN PATENT DOCUMENTS

| | | | |
|---|---|---|---|
| 0190574 | 8/1986 | European Pat. Off. | H01L 41/08 |
| 1 474 369 | 5/1977 | United Kingdom | H01L 41/10 |

*Primary Examiner*—Thomas M. Dougherty
*Attorney, Agent, or Firm*—Oblon, Spivak, McClelland, Maier & Neustadt, P.C.

[57] ABSTRACT

The invention relates to a process for manufacturing a piezoelectric component and to the component resulting from such a process.

According to the invention, the manufacturing process comprises the stacking of at least one piezoelectric element (1) and of at least two metallic electrodes (2), each piezoelectric element (1) being inserted between two metallic electrodes (2), characterized in that each piezoelectric element and each metallic electrode is produced, respectively, by coiling a piezoelectric film and by coiling a metallized film.

10 Claims, 2 Drawing Sheets

PROCESS FOR MANUFACTURING A PIEZOELECTRIC COMPONENT

The present invention relates to a process for manufacturing a piezoelectric component and to the component resulting from such a process.

Piezoelectric components are used, inter alia, in the field of acoustics. They then form part of the equipment of loudspeakers, microphones or even hydrophones.

The application described in the present patent application relates more particularly to acoustic sensors used for underwater detection and, especially, the sensors used in towed linear antennas.

However, the invention relates to all fields of application using piezoelectric components.

The acoustic sensors used in towed linear antennas generally consist of a piezoelectric dielectric piece to which are adhesively bonded two metallic electrodes.

The potential difference appearing at the terminals of the two electrodes is then a function of the difference in the pressures which are exerted on them.

In order to make the sensor insensitive to acceleration, it is known to one skilled in the art that the sensor consists of two piezoelectric dielectric pieces, the polarization directions of which are opposed.

The sensor thus formed is then mounted in a case so as to protect the piezoelectric pieces from chemicals, for example oil, which surround the component in the final mounting.

The manufacture of such a sensor has many drawbacks. Machining the piezoelectric pieces is difficult. The reason for this is that the dielectrics used are brittle and many pieces can break during handling operations.

Moreover, the piezoelectric pieces and the metallic electrodes are joined together by adhesive bonding, stacking the mechanical pieces flat, one on top of another, something which constitutes a lengthy and tedious operation.

Finally, the placing in a case requires an additional operation. This manufacturing process therefore requires tricky and quite lengthy operations leading to a high cost.

The invention does not have these drawbacks.

It is also known to manufacture piezoelectric components by rolling, such as those described in European Patent EP-A-0,190,574.

The subject of the invention is a process for manufacturing a piezoelectric component consisting of the stacking of at least one piezoelectric dielectric element and of at least two metallic electrodes, each piezoelectric element being inserted between two metallic electrodes, characterized in that each piezoelectric element and each metallic electrode is produced, respectively, by coiling a piezoelectric film and by coiling a metallized film.

The subject of the invention is also the piezoelectric component resulting from such a process.

One advantage of the invention is therefore the simplification of the process for manufacturing the piezoelectric components.

Other features and advantages of the invention will appear on reading a preferred embodiment, given with reference to the hereto-appended figures in which:

FIG. 1 is a sectional view of a piezoelectric component according to the invention.

This component is of the stacked type, but the invention also relates to components of the coiled type. For reasons of convenience, the component shown in FIG. 1 consists only of 2 piezoelectric elements 1 hugging a metallic electrode 2, the said piezoelectric elements 1 themselves being sandwiched between two metallic electrodes.

Figure 1:
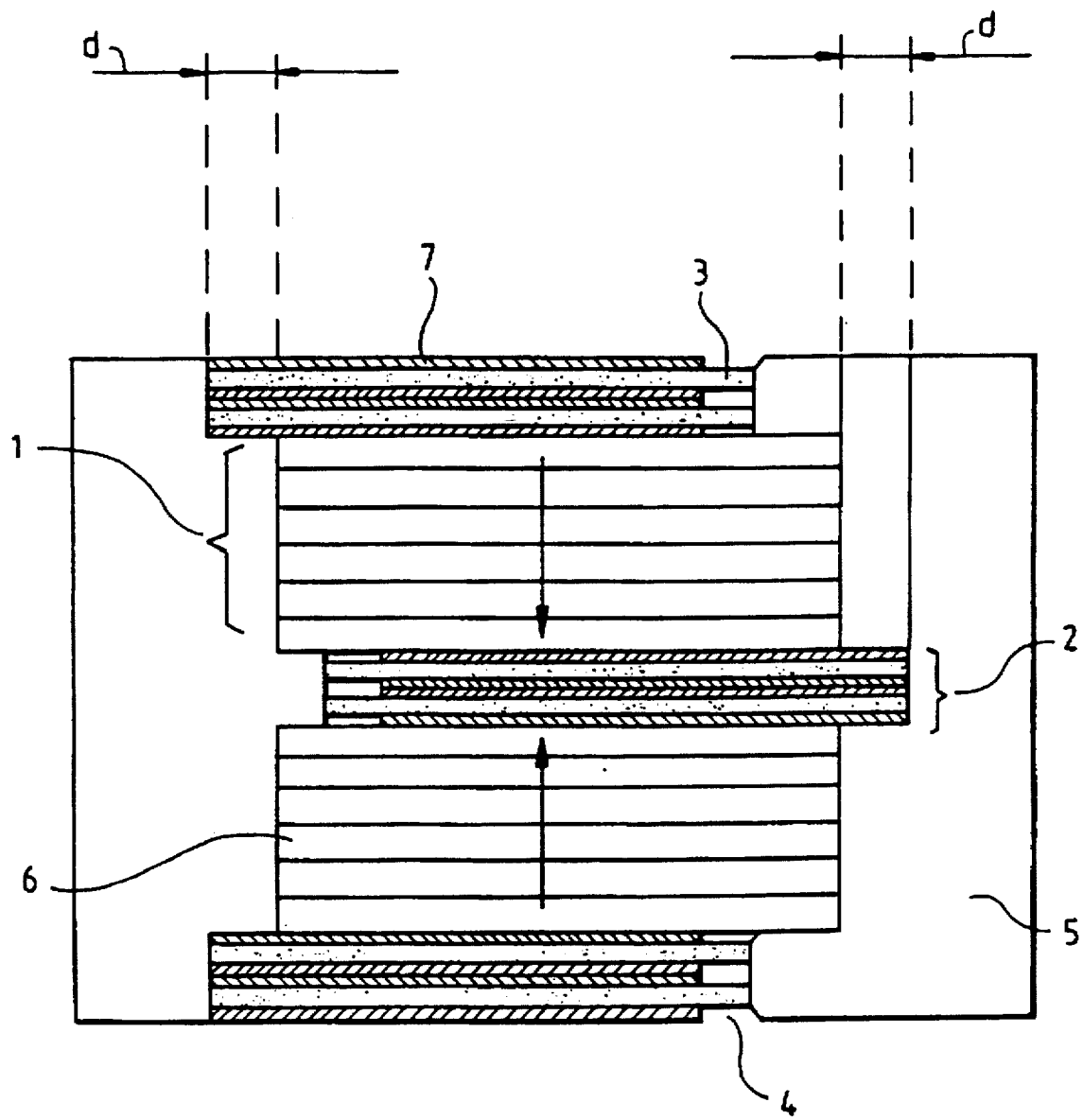
FIG. 1 represents a sectional view of a piezoelectric component according to the invention.

In general, the piezoelectric elements are n in number (n being an integer greater than or equal to 1) and are sandwiched in a regular manner Between n+1 metallized electrodes 2. According to the preferred embodiment of the invention, n =10. As shown in FIG. 1, two successive electrodes 2 surround one dielectric element and each of the two electrodes 2 exhibits an overhang d with respect to the dielectric element, the overhang exhibited by one being in the opposite direction to the overhang exhibited by the other. In general, the electrodes 2 are thus offset in a regular manner with respect to one another. All the electrodes located on the same side are then connected by the same metallic plate 5.

Each piezoelectric element 1 consists of a set of p piezoelectric dielectric sheets 6, where p is an integer, for example equal to 40. For reasons of convenience, FIG. 1 shows a configuration for which p=6.

The material forming the sheets 6 is polyvinylidene fluoride (PVDF) or a copolymer consisting of the said polyvinylidene fluoride and of trifluoroethylene (TrFE)

These ferroelectric polymers or copolymers have many advantages compared to the usual ceramics. On the one hand, they have the advantages of elastomers (flexibility and the possibility of producing large areas) and, on the other hand, they have piezoelectric properties in hydrostatic mode which are greatly superior to those of the said ceramics. In addition, their mechanical impedance is closer to that of water. This has advantages for underwater and biological applications.

In order to exhibit piezoelectric activity, the polymers mentioned hereinabove must be polarized by an electric field. The electric field must then be higher the greater the thickness of the polymer.

According to the invention, the dielectric sheets 6 chosen have a relatively small thickness, of between a few microns and 50 microns. According to the preferred embodiment, their thickness is equal to 25 microns. Advantageously, the polarization is then carried out, for example by CORONA effect, directly at the exit from the extruder shaping the dielectric sheets.

On the final component, the piezoelectric elements 1 may all be polarized in the same direction. They may also be half polarized in one direction and half in an opposite direction, as shown symbolically in FIG. 1 by means of arrows. This polarization reversal is necessary in the case where it is desired that the component be insensitive to the accelerations that it is likely to experience while it is being used.

The metallized electrodes 2 consist either of entirely metallized sheets, for example aluminium foils, or of dielectric sheets 3 covered with metallizations 7 on at least one of their faces, as shown in FIG. 1. The material forming the dielectric sheets 3 is chosen from materials such as polyester, polycarbonate, polysulphone, polypropylene or any other similar material. The metallization of the dielectric sheets is, for example, carried out by means of a vacuum evaporation process or any other process known to one skilled in the art. The metallization 7 is, for example, made of aluminium, zinc or an alloy of aluminium and zinc.

The number q of sheets 3 forming each metallized electrode 2 is at least equal to 1.

On one of its two edges, each dielectric film 3 has a non-metallized lateral margin 4. This margin is necessary in order to prevent the metallization 7 from short-circuiting the 2 facing plates 5.

It is the entirely metallized ends of the sheets 3 which provide the overhang d mentioned above. The lateral margins 4 of two successive electrodes 2 are then on opposite sides, making it possible to define, in succession, right-margin electrodes and left-margin electrodes.

According to the invention, the stacking of the various sheets forming the piezoelectric component is carried out by winding in succession, over a large-diameter wheel, piezoelectric films and metallized films, these being cut beforehand to the width that the component is to have.

The successive steps of the process according to the invention may therefore be set forth as follows so as to produce, for example, a component comprising two dielectric elements and three electrodes:

coiling a first metallized film with a number of turns equal to q, the said metallized film making it possible to form an electrode 2, for example a right-margin electrode;

coiling a first piezoelectric film with a number of turns equal to p, the said film making it possible to form a piezoelectric element 1 whose polarization is in a first direction;

coiling a second metallized film with a number of turns equal to q, the said metallized film making it possible to form an electrode 2, for example a left-margin electrode;

coiling a second piezoelectric film with a number of turns equal to p, the said film making it possible to form a piezoelectric element 1 whose polarization is in a second direction, opposite the said first direction;

coiling the first metallized film with a number of turns equal to q, the said metallized film making it possible to form an electrode 2, for example a right-margin electrode.

In general, the number of successive coiled assemblies may vary. Thus, as was mentioned previously, the invention relates to a component having n piezoelectric elements 1 and n+1 metallic electrodes 2.

The number n of piezoelectric elements is chosen so as to achieve the desired thickness e of the component.

One advantage of the invention therefore consists in being able to produce components of variable thickness e easily.

The thickness of the piezoelectric element plays an important role in the design of the component. The reason for this is that the sensitivity Sh of a piezoelectric component, given by the ratio of the voltage delivered by the component to the pressure exerted on it, becomes better the greater its thickness e. In point of fact, as was mentioned previously, it becomes more and more difficult to polarize a dielectric as its thickness increases.

The fact of polarizing the dielectric film before coiling, on a small thickness, is therefore an advantage of the process according to the invention since this makes it possible to produce high-sensitivity components easily, the thickness of which could be achieved only with great difficulty if the polarization were carried out on the final component. By way of example, the process according to the invention makes it possible to obtain acoustic sensors whose hydrophone response is of the order of minus 200 dB (reference 1 volt per micropascal).

According to the preferred embodiment, the polarization of the dielectric is carried out before coiling the films, whatever the thickness of the final component. However, the invention also relates to a process where the polarization is carried out on the final component insofar as the thickness of the said component allows it.

Figure 2:
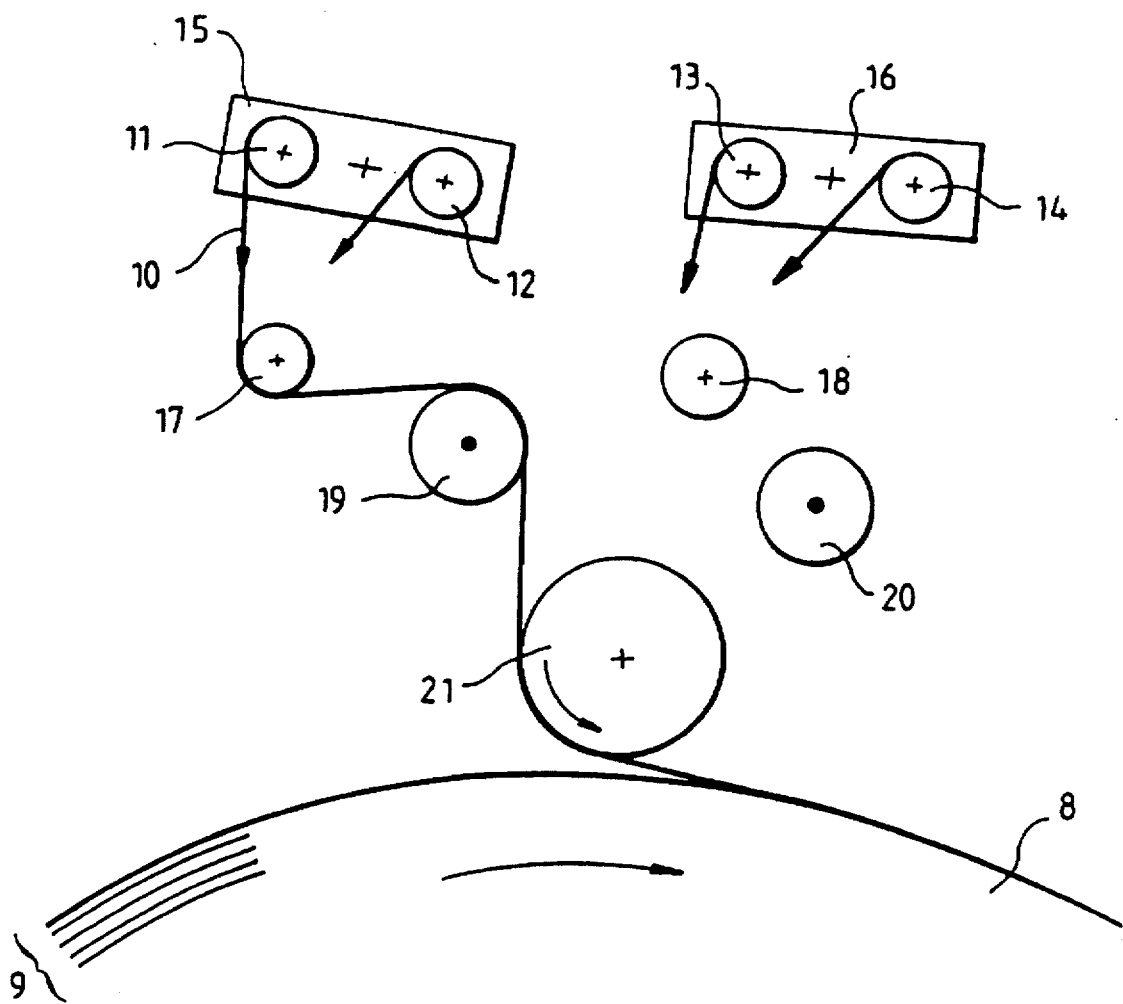
FIG. 2 represents a diagrammatic view of a machine allowing manufacture of piezoelectric components according to the preferred embodiment of the invention.

FIG. 2 represents a diagrammatic view of a machine making it possible to produce the coiled assemblies mentioned hereinabove.

This machine includes a large-diameter wheel 8 onto which a tape 9 is coiled. A first take-off reel 15 holds the metallized dielectric films intended to form the electrodes 2. These films are wound in the form of two discs, one of which, for example the disc 11, holds the film intended to form the so-called right-margin electrodes and the other of which, for example the disc 12, holds the film intended to form the so-called left-margin electrodes.

A second take-off reel 16 holds the piezoelectric dielectric films intended to form the piezoelectric elements 1. These films are also wound in the form of discs, one of which for example the disc 13, holds the film intended to form an element 1 whose polarization is in a first direction and the other of which, for example the disc 14, holds the film intended to form an element 1 whose polarization is in a second direction, opposite to the said first direction.

The metallic and dielectric films are wound in succession, as was mentioned previously. They are guided by means of respective rolls 19 and 20.

It is these positioning means which make it possible to provide the overhang d mentioned previously. Once they are positioned, the films pass via a guide wheel 21 before being fed onto the wheel 8.

At the end of this winding step, a tape of predetermined thickness is thus formed.

Next, the lateral faces of this tape are covered with a metal or a conducting alloy so as to form the subsequent plates 5 of the piezoelectric components. Thus, a plate 5 may be formed, for example, by a first layer of aluminium on which are deposited in succession a layer of copper and a layer of tin.

The tape thus metallized on its lateral faces is then heat stabilized under stress so as to provide it with mechanical rigidity.

Next, the tape is cut up into individual blocks, each block forming a piezoelectric component.

Should this prove necessary, interface connections, for example tapes or wires, are then attached to the plates 5 of the component by any means known to one skilled in the art.

In the case of towed linear antennas, it was mentioned previously that chemicals, for example oil, form the environment of the acoustic sensors. According to the prior art, it is necessary to protect the component from these chemicals by encasing it.

The piezoelectric material used according to invention (PVDF or PVDF/TrFE) is not sensitive to the said chemicals. Another advantage of the invention therefore consists in not having to encase the component. It is then possible, for example, to wire up the sensor directly to the electronic circuit whose function is to amplify the voltage delivered by the component.

When this proves to be necessary, the component may in any case be protected by encapsulation or by any means known to one skilled in the art.

The preferred embodiment of the invention described hereinabove relates to components of the stacked type. However, the invention also relates to components of the coiled type. The dielectric and metallic films are then coiled with small diameters, for example a diameter of 1 millimeter. Each coil therefore forms a piezoelectric component of the coiled type.

According to the preferred embodiment of the invention, the electrodes 2 are formed separately from the dielectric elements 1.

The invention also relates to components for which the manufacture is carried out by winding two piezoelectric dielectric films which are metallized beforehand.

The two films are then wound on the large-diameter wheel, having an offset one with respect to the other. Both films have a non-metallized margin on one of its edges so as to prevent the short circuits which, without this, could appear when metallizing the lateral faces of the tape formed by the stack.

We claim:

1. Process for manufacturing a piezoelectric component consisting of the stacking of at least one piezoelectric element and of at least two metallic electrodes, each piezoelectric element being inserted between two metallic electrodes, characterized in that it comprises n steps of coiling a piezoelectric film with a number of turns equal to p and n+1 steps of coiling a metallic film with a number of turns equal to q, n, p and q with being integers greater than or equal to 1, each step of coiling of piezoelectric film making it possible to produce a piezoelectric element and each step of coiling of metallic film making it possible to produce a metallic electrode, each coiling of metallic film being carried out so that each metallic electrode has an overhang (d) with respect to the piezoelectric element that adjoins it, the overhangs (d) of two metallic electrodes hugging the same piezoelectric element being located on opposite sides wherein said metallic films are produced by using dielectric sheets covered beforehand with metallizations on at least one of their faces, each metallization having non-metallized margin.

2. Process according to claim 1, characterized in that the lateral faces of the stacks formed by the said coiled assemblies are covered with a metal or a conducting alloy intended to form the plates of the subsequent components.

3. Process according to claim 2, characterized in that the piezoelectric films and the metallized films are coiled on a wheel so as to form a tape and in that the tape is cut into individual blocks each forming a piezoelectric component of the stacked type.

4. Process according to claim 2, characterized in that the coiled assembly of the piezoelectric films and of the metallized films constitutes a piezoelectric component of the coiled type.

5. Process according to claim 3, characterized in that two successive piezoelectric coiled assemblies are produced, one using a first piezoelectric film polarized in a first direction and the other using a second piezoelectric film whose polarization is chosen in the direction opposite to the first direction.

6. Process according to claim 4, characterized in that two successive piezoelectric coiled assemblies are produced, one using a first piezoelectric film polarized in a first direction and the other using a second piezoelectric film whose polarization is chosen in the direction opposite to the first direction.

7. Process according to any one of claim 1, characterized in that the metallic films are produced using entirely metallized sheets.

8. Piezoelectric component of the stacked type consisting of the stack of piezoelectric elements and metallic electrodes, two successive metallic electrodes flanking a piezoelectric element, characterized in that each piezoelectric element consists of the stack of p sheets of polyvinylidene fluoride (PVDF) or of copolymer consisting of the said polyfluoride and of trifluoroethylene, p being an integer greater than or equal to 1, the said stack of p sheets being formed by coiling the same piezoelectric film with a number of turns equal to p and in that each metallic electrode consists of the stack of q metallic sheets, q being an integer greater than or equal to 1, the said stack of q metallic sheets being produced by coiling the same metallic film with the number of turns equal to q, each metallic electrode having an overhang (d) with respect to the piezoelectric element that adjoins it, the overhangs (d) of two metallic electrodes hugging the same piezoelectric element being located on opposite sides wherein said piezoelectric component further comprises metallic plates on the side faces of said stack of piezoelectric elements and of metallic electrodes and wherein said metallic sheets consist of a dielectric sheet covered with a metallization on at least one of its faces, each metallization having a non-metallized margin.

9. Piezoelectric component according to claim 8, characterized in that the said metallization is made of aluminium.

10. Piezoelectric component according to claim 8, characterized in that the metallic plates are formed by a layer of aluminium, by a layer of copper deposited on the said layer of aluminium and by a layer of tin deposited on the said layer of copper.

* * * * *